United States Patent [19]

Wasmer et al.

[11] Patent Number: 5,005,069

[45] Date of Patent: Apr. 2, 1991

[54] RECTIFIER AND METHOD

[75] Inventors: William D. Wasmer, Fountain Hills; Peter J. Gillespie; James G. Lippmann, both of Mesa; Hiep M. Le, Phoenix, all of Ariz.

[73] Assignee: Motorola Inc., Schaumburg, Ill.

[21] Appl. No.: 516,656

[22] Filed: Apr. 30, 1990

[51] Int. Cl.[5] .................... H01L 23/28; H01L 23/02; H01L 23/12; H01L 23/42

[52] U.S. Cl. ........................ 357/72; 357/74; 357/76; 357/79

[58] Field of Search ............... 357/68, 72, 77, 79, 357/76

[56] References Cited

U.S. PATENT DOCUMENTS

| | | | |
|---|---|---|---|
| 3,513,362 | 5/1970 | Yamamoto | 357/74 |
| 3,717,523 | 2/1973 | Dunsche | 156/69 |
| 3,743,896 | 7/1973 | Weiske et al. | 357/74 |
| 4,303,935 | 12/1981 | Ragaly | 357/76 |
| 4,314,271 | 2/1982 | Heyke et al. | 357/76 |
| 4,498,096 | 2/1985 | Addie et al. | 357/67 |
| 4,532,539 | 7/1985 | Friszer | 357/81 |

*Primary Examiner*—Rolf Hille
*Assistant Examiner*—D. Ostrowski
*Attorney, Agent, or Firm*—Robert M. Handy

[57] ABSTRACT

A rectifier (60) is formedf by soldering a diode chip (66) in a cavity (64) in a metal base (62) having a metal sidewall (69), soldering the head (72) of an axial lead (70) to the chip (66), and filling the cavity (64) with an encapsulation (88). An outward leaning partition (80) is provided in the cavity (64) around and at about the same elevation as the chip (66). The encapsulation (88) covers the lead head (72) and the partition (80), and fills the space between the partition (80) and the base sidewall (69). This locks all the parts together, giving improved reliability and lead stiffnes at low cost.

10 Claims, 2 Drawing Sheets

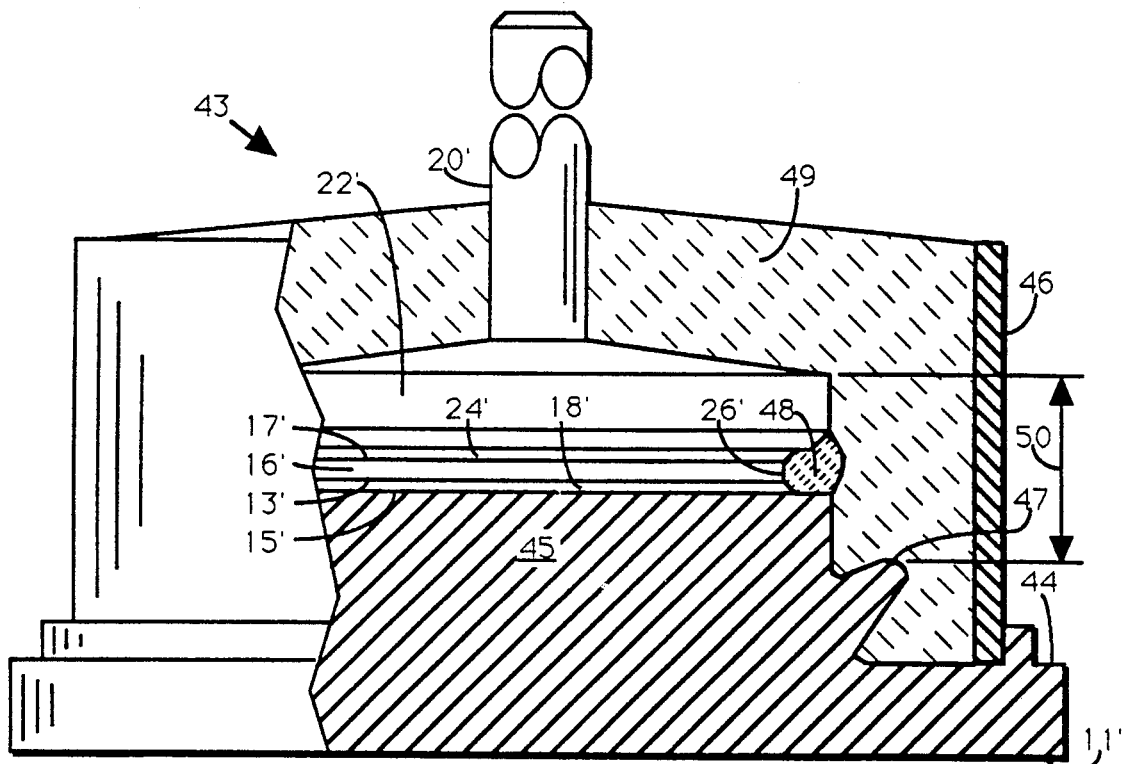
PRIOR ART FIG. 3
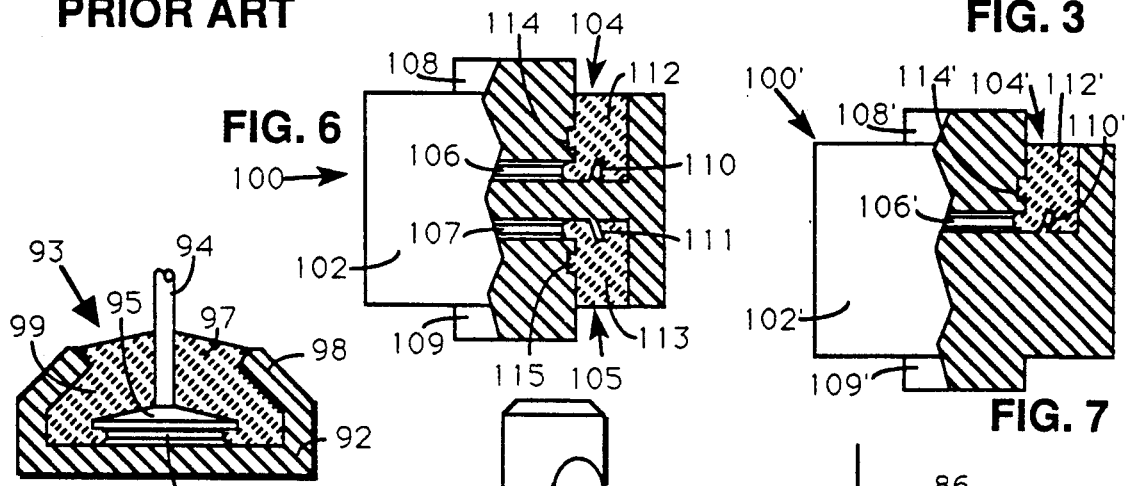
FIG. 6
FIG. 5
FIG. 7
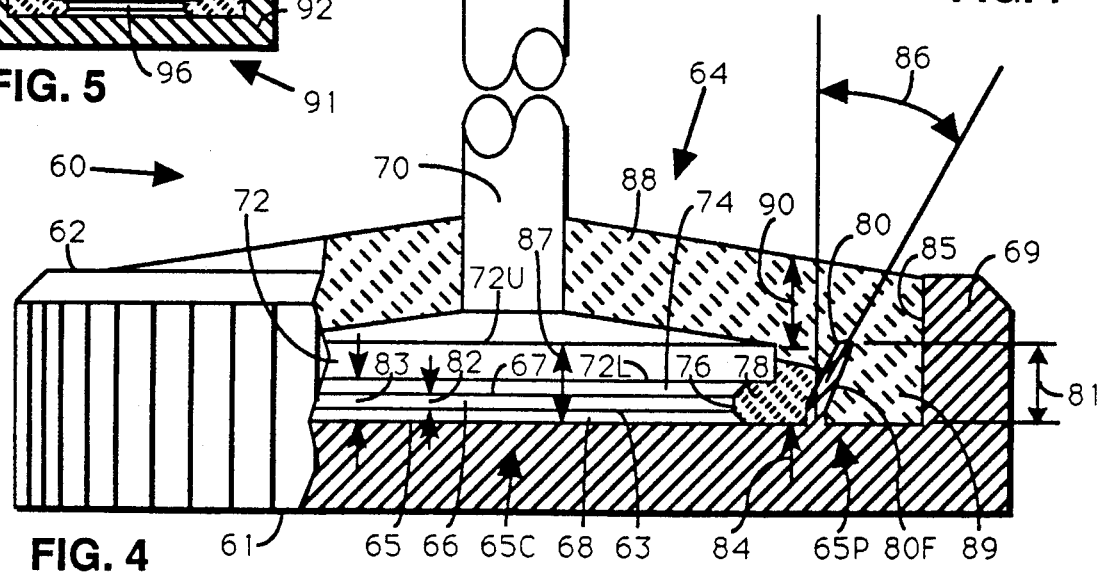
FIG. 4

RECTIFIER AND METHOD

FIELD OF THE INVENTION

This invention concerns improved means and methods for semiconductor devices and, more particularly, an improved solid state rectifier and method therefor.

BACKGROUND OF THE INVENTION

Solid state diodes are extensively used in many electronic applications, especially in connection with vehicle electrical systems. The largest use in vehicles is as rectifiers in the vehicle alternator. Frequently, the diodes are constructed using a silicon diode chip which has one face soldered to a nickel coated metal base and with a nickel coated copper lead attached to the other face of the chip. The chip is covered with an encapsulation of some type. The base is usually designed to be press-fitted, clamped or soldered into a rectifier bridge assembly mounted in an end bell of the alternator. Many millions of alternator diodes have been made in various forms each year for decades.

FIG. 1 shows a simplified side and partially cut-away cross-sectional view of one such, prior art, press-fit diode 10, useful for vehicle applications. Diode 10 has cylindrical base 12 with cavity 14. Lower face 11 of base 12 is conveniently used for heat removal. Lower face 13 of semiconductor die 16 is mounted on cavity bottom 15 by solder 18. Die 16 contains at least one PN junction. Lead 20 has flattened portion 22 attached to upper face 17 of die 16 by solder 24. Such leads are referred to in the art as "nail-head" leads. Edge 26 of die 16 is covered and the remaining space in cavity 14 is filled with encapsulant 30 of, for example, silicone rubber. Stress relief bend 32 is frequently provided in lead 20.

While diode 10 is simple and comparatively inexpensive to manufacture, and has been widely used for years, it suffers from a number of limitations well known in the art. For example, when diode 10 is temperature cycled (e.g., by applying and removing power), there is differential expansion and contraction of the various parts. This causes fatigue of solder joints 18, 24 which may eventually crack or separate so that the diode becomes electrically inoperative or of high resistance.

Another problem has to do with shrinkage of encapsulant 30. If adhesion of encapsulant 30 to base 12 is less than perfect then encapsulant 30 may separate from base 12 as it cures or cools. When combined with solder fatigue failure, this can lead to mechanical failure of the diode.

A number of attempts have been made to overcome these and other problems associated with such prior art devices. FIGS. 2 shows a simplified side and partially cut-away cross-sectional view of, prior art, press-fit diode 34, similar to that described in U.S. Pat. Nos. 3,743,896-Welske et al., and 3,717,523-Dunsche, which are incorporated herein by reference. Device 34 has base 36 with cavity 38. Die 16 is mounted to bottom 15 of cavity 38 by solder 18 and to flattened nail head 22 of lead 20 by solder 24, in substantially the same manner as in FIG. 1, and passivation 28 (e.g., silicone rubber) is provided on die edge 26. In diode 34, nail head 22 of lead 20 is forced against die 16 by annular spring washer 39, which in turn is held in a compressed state by internal annular lid 40 of electrically insulating material. Annular lid 40 is held in place in cavity 38 by inwardly bent wall portion 41 of base 36, which is bent over after die 16, solder 18, 24, passivation 28, spring 39 and lid 40 have been installed in cavity 38 and spring 39 compressed. Outer cover or encapsulation 42 (e.g., epoxy resin) is then provided over inner lid 40 and wall portion 41 of base 36.

An advantage of the arrangement of FIG. 2 is that spring 39, lid 40 and wall portion 41 hold lead 20, die 16 and base 36 together even if solder 18, 24 fails due to thermal cycling fatigue. Thus, the diode may continue to operate electrically even after it has been thermally cycled to the point of solder failure. While this is a great advantage from a reliability point of view, the structure of FIG. 2 is comparatively very complex and is prohibitively costly in many applications.

Another approach that has been tried in the prior art for improving the thermal or power cycling performance of axial lead diodes for alternators and the like, is illustrated in FIG. 3. This device uses a base with a pedestal rather than a cavity. Diode 43 has metal base 44 with external heat transfer surface 11' and pedestal 45. The flat upper surface of pedestal 45 forms die attachment region 15' analogous to die bonding region 15 of FIGS. 1–2. Lower surface 13' of die 16' is attached to die attachment region 15' of pedestal 45 by solder 18' and nail head 22' of lead 20' is attached to upper surface 17' of die 16' by solder 24' in the same manner as for FIGS. 1–2.

Device 43 has annular plastic sleeve 46 attached to base 44 near its periphery and substantially below the elevation of die attachment region 15' on pedestal 45. Annular protrusion 47 is provided extending from pedestal 45 toward sleeve 46. Passivant 48 is provided on die edge 26' and encapsulation plastic 49 is provided covering nail head 22' and filling the remaining space between sleeve 46 and pedestal 45, protrusion 47 and passivant 48. While the device of FIG. 3 provides improved resistance to thermal fatigue as compared to the structure of FIG. 1, it does not eliminate the problem. Further, the device of FIG. 3 requires additional piece parts and, other things being equal, has a greater thermal impedance between die 16 and heat transfer face 11'.

Despite their long standing use and the extensive engineering development that has gone into the design and manufacture of such diodes, a number of problems and deficiencies remain. For example, the lead soldered to the chip face often fails under moderate tension, the encapsulant cracks or fractures during lead bending and vibration, the solder joints between the chip and the base and/or between the chip and the lead fatigue and fail under temperature and power cycling, and/or the finished diode is unduly expensive. None of the prior art approaches have overcome these and other deficiencies well known in the art. Thus, a need continues to exist for improved diode structures and methods of fabrication which have adequate lead pull strength and improved resistance to catastrophic thermal cycling failure, but which are still of low cost.

SUMMARY OF THE INVENTION

It is an object of the present invention to provide an improved structure and method for a solid state device, particularly a semiconductor diode suitable for use in vehicle applications. It is a further objective to provide such employing a minimum number of piece parts and inexpensive materials and construction while still having adequate lead pull strength and improved temperature and power cycling tolerance.

The foregoing and other objects and advantages are provided by the combination comprising, (i) a metallic base with opposed first and second major faces and a cavity extending into the base from the first face, wherein the cavity has a bottom and a side extending between the bottom and the first face, wherein the bottom of the cavity has a central die bond region for receiving a semiconductor die and a peripheral region located between the central region and the side of the cavity, (ii) a semiconductor die with one face centrally mounted on the die bond region, (iii) a metallic electrode attached to an opposed, upper, face of the semiconductor die and extending away from the base, (iv) an inclined wall secured to or integral with the base, located in the peripheral region between the die bond region and the side of the cavity, and extending upwardly and outwardly from the bottom of the cavity part way toward the first surface, and (v) an encapsulation in the cavity covering edges of the semiconductor die and enclosing the inclined wall.

It is desirable that the inclined wall be integral with the base, that the root of the wall be located at about the same elevation in the cavity as the die bond region or in close proximity thereto, and that the top of the inclined wall extend above the upper surface of the die. The metallic electrode has a flattened (nail-head) portion in electrical contact with the upper face of the rectifier die. In general it is desirable that the top of the wall be about level with the upper surface of the lead nail-head.

It is desirable that the wall incline outwardly at about fifteen degrees with respect to the normal to the die bond region. It is further desirable that the molded encapsulation comprises a passivation portion in contact with the semiconductor die and a portion of higher mechanical strength covering the passivation portion and the wall and substantially filling the cavity.

The forgoing device is conveniently made by the method comprising, (i) providing a metallic base having a cavity therein with a bottom having a central die bond region for receiving a semiconductor die and a wall at least partially surrounding the die bond region and extending upwardly from approximately the same level as the die bond region, wherein the wall is outwardly inclined away from the die bond region and, desirably, of a height extending to or above an upper surface of the semiconductor die, (ii) bonding the semiconductor die to the die bond region (iii) attaching an electrical lead to the semiconductor die, and (iv) substantially filling the cavity and covering the wall with an encapsulation material.

It is desirable that the filling step comprises, first, covering an edge of the semiconductor die between the base and the lead with a passivant material and then filling the cavity and covering the wall with an encapsulation material. It is further convenient that the bonding step comprise soldering the die to the base and the attaching step comprise soldering the lead to the die. It is desirable but not essential that the bonding and attaching steps be performed substantially at the same time.

It is desirable, prior to the filling step, to coat an edge of the die between the base and lead with a passivation material using the up-standing wall as a dam. The passivation should be cured prior to the filling step. The method and structure of the present invention are particularly well suited for use with encapsulant materials that shrink slightly on curing. This is a particular feature of the present invention.

The present invention will be more fully understood by considering the below listed drawings and explanation thereof that follows.

BRIEF DESCRIPTION OF THE DRAWINGS

FIGS. 1-3 show simplified side and partially cut-away cross-sectional views of press-fit diodes according to the prior art;

FIG. 4 shows a simplified side and partially cut-away cross-sectional view of a diode according to a preferred embodiment of the present invention;

FIG. 5 shows a highly simplified side cross-sectional view of another press-fit diode subjected to comparison tests;

FIGS. 6-7 show highly simplified side and partially cut-away cross-sectional views of diodes according to further embodiments of the present invention;

DETAILED DESCRIPTION OF THE DRAWINGS

Figure 1:
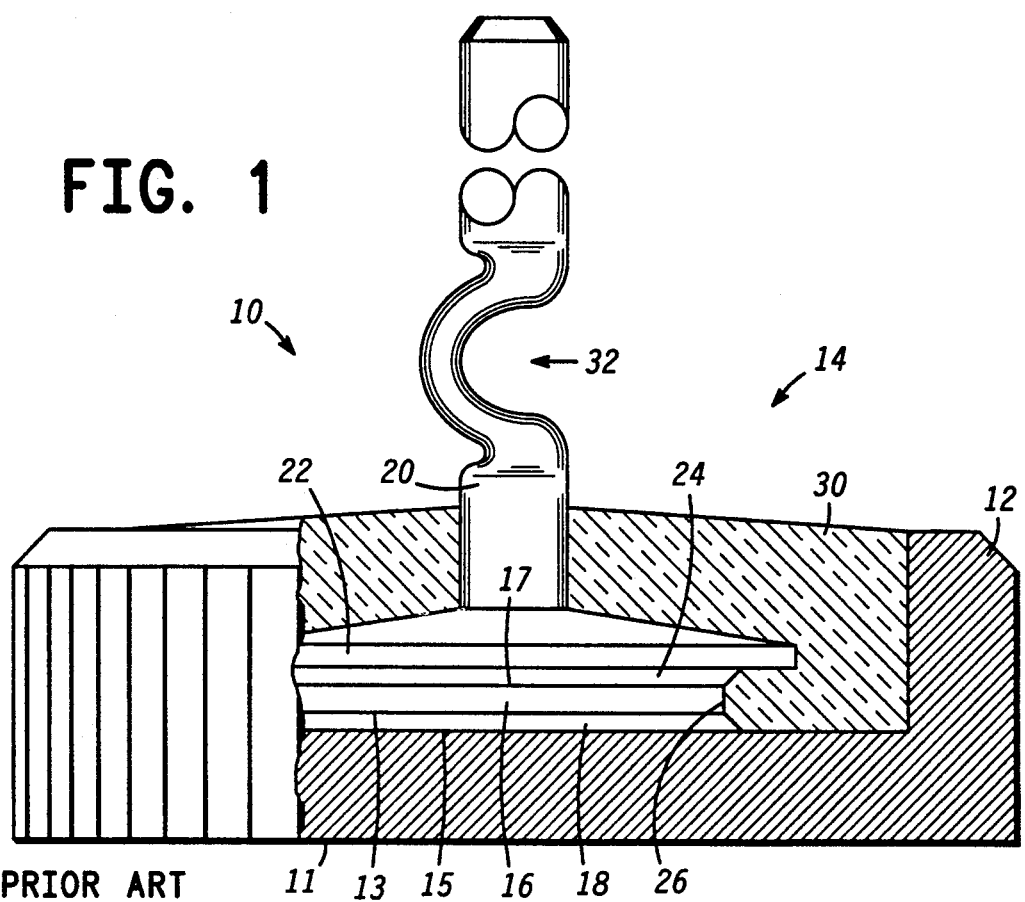
Figure 2:
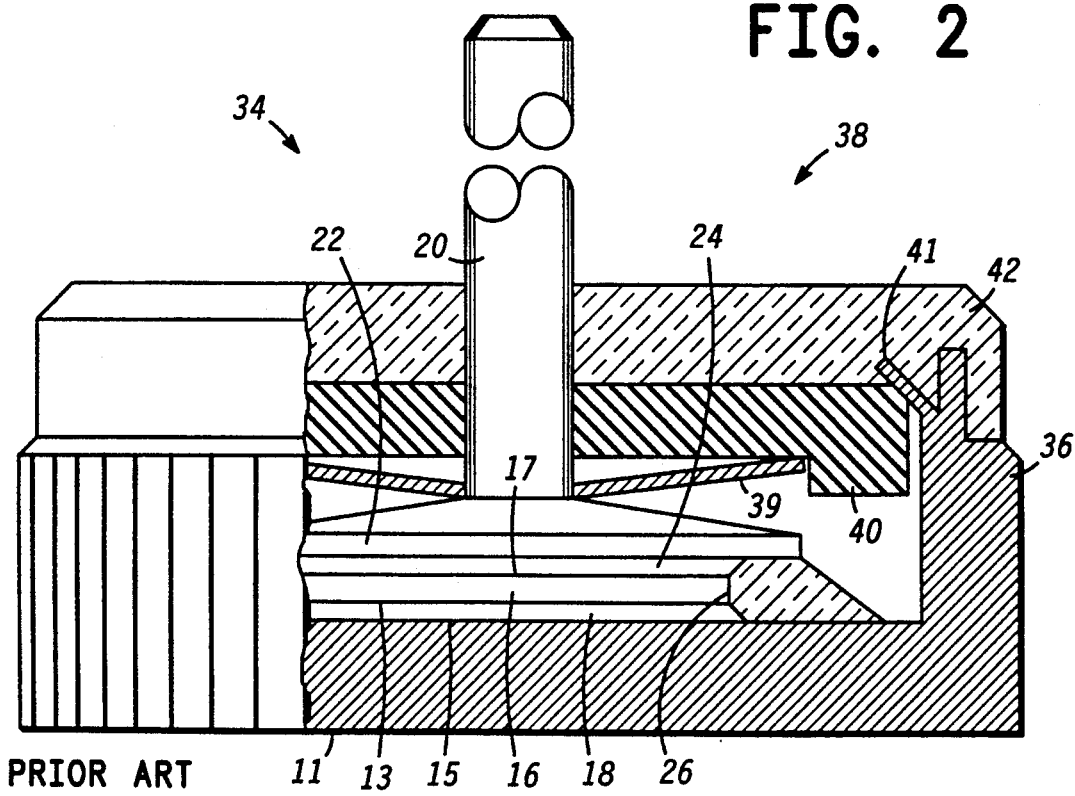

Prior art FIGS. 1-3 have been previously discussed. The problems associated therewith and with other prior art implementations are overcome by the structure illustrated in FIG. 4 which shows a simplified side and partially cut-away cross-sectional view of a diode according to a preferred embodiment of the present invention. Diode 60 comprises metal base 62 having cavity 64 therein. Lower face 61 of base 62 forms a convenient heat extraction face. Cavity 64 has bottom 65 with substantially flat central region 65C on which is mounted lower face 63 of semiconductor die 66 (e.g., a rectifier diode) by solder 68, although other attachment means well known in the art can also be used. Cavity 64 is circumscribed by sides 69 of base 62.

Central die bond region 65C is surrounded by peripheral region 65P of cavity bottom 65. Die 66 has upper face 67 which is coupled to flattened "nail head" portion 72 of lead 70 by solder 74, although other bonding means well known in the art can also be used. Die 66, solder 68, 74, lead 70 and lead head 72 are analogous in function to die 16, solder 18, 24, lead 20 and lead head 22 of FIGS. 1~3. Base 62 is conveniently of copper, or aluminum, or iron, or other metals, or combinations or laminates thereof. OFHC copper is preferred. Lead 70 is conveniently of copper, or aluminum, or iron, or other metals, or combinations thereof. OFHC copper is preferred. Die mount region 65C and lower face 72L of nail head portion 72 of lead 70 are conveniently nickel plated.

Extending upwardly and outwardly from bottom 65 of cavity 64 of base 62, laterally outside of central die bond region 65C, is wall 80. It is desirable that wall 80 substantially surround central region 65C, that is, be a continuous perimeter wall which closes on itself in plan view, but that is not essential. It may be interrupted, that is, composed of one or more spaced-apart portions with gaps between. Further, it need not be circular in plan view but may be rectangular or of portions forming parts of a circle, ellipse, rectangle or other polygonal shape.

It is desirable that height 81 of wall 80 above central region 65C of bottom 65 containing die 66, exceed the elevation of upper surface 67 of die 66, more conveniently at least equal or exceed elevation 83 of lower surface 72L of heat portion 72, and preferably about equal elevation 84 of upper surface 72U at the outer perimeter of head portion 72 of lead 70 above central region 65C of cavity bottom 65. It is desirable that wall 80 incline outwardly by angle 86 with respect to the normal to bottom portion 65C of cavity 64. Angle 86 is usefully about 3-60 degrees, conveniently about 5-45 degrees and preferably about 10-20 degrees with about 15 degrees being typical. Wall 80, when viewed in cross-section as in FIG. 4, may incline outwardly in a curved, straight or compound fashion, or a combination thereof. It is only essential that it be outwardly inclined.

Wall 80 may be an integral part of base 62 or may be formed separately of the same or different material and attached thereto Having wall 80 formed as a integral part of base 62 is preferred. Base 62 is conveniently formed by stamping, heading, forging, etching, turning, machining or a combination thereof with impact extrusion forging being preferred, and wall 80 is conveniently formed by like methods at the same time. It is convenient to initially form wall 80 in an upright, vertical position, e.g., as an upright cylinder, and then, in a second forming operation, radially stretch the upper end of the upright cylinder until the side thereof forms the side of a cone having the desired wall angle. This second forming operation is conveniently accomplished by using a cone-shaped tool.

Die edge 76 is desirably covered by passivant 78, e.g., a polyimide or silicone rubber, and the remaining space in cavity 64 is substantially filled by encapsulant 88, e.g., an epoxy. Encapsulant 88 must at least extend around outer face 80F of wall 80. It is desirable that encapsulant 88 substantially fill space 89 between outward wall face 80F and interior surface 85 of cavity side 69.

Wall 80 provides several important functions which contribute materially to the improved thermal cycling behavior and lead pull strength of the invented device. First, by having face 80F of wall 80 outwardly inclined and covered by encapsulant 88, encapsulant 88 cannot separate from base 62 except by breaking or deforming wall 80 or breaking off the portion of encapsulant 88 in region 89.

Second, by having face 80F of wall 80 outwardly inclined, any shrinkage of encapsulant 84 on curing tends to retain encapsulant 88 in base 62. Outwardly inclined wall face 80F acts as a wedge forcing encapsulant 88 more tightly against lower surface 65 of base 62 as encapsulant 88 shrinks during curing. This is in contrast to inwardly inclined walls used in some prior art arrangements that have the opposite effect. Thus, even if encapsulant 88 separates from base 62 at peripheral cavity sidewall surface 85 due to excessive shrinkage, encapsulant 88 remains tightly sealed to base 62 at upstanding wall 80 by virtue of the wedging action provided by the outward inclination of face 80F of wall 80.

Third, the combination of the location of wall 80 extending upward from the periphery of the die bonding region of the base and the height of the wall being at least equal to the elevation of the upper die surface and preferably slightly higher, provides a convenient dam for constraining passivant 78 to the immediate vicinity of die edge 76. Other things being equal, this reduces the amount of material needed for effective passivation and reduces manufacturing cost. This is a particular feature of the present invention.

Fourth, the combination of the location of wall 80 in close proximity to the periphery of the die bonding region of the base and the height of the wall being at least equal to the elevation of the upper die surface and preferably about equal to the elevation of the periphery of the top of the lead nail head, brings wall locking face 80F and lead nail head 72 comparatively close together. This is a particular feature of the present invention and is believed provide a device of substantially increased ruggedness and to contribute substantially to the improved results of the present device over prior art designs.

For example, while outward sloping protrusion 47 of the prior art device of FIG. 3 may also provide some locking action of encapsulation 49 to base 44, protrusion 47 is located well below the elevation of die bonding region 15' and die 16', and at substantial distance 50 from lead nail head 22'. A substantial portion of the locking action of plastic encapsulation 49 of the device of FIG. 3 provided by protrusion 47 is dissipated over distance 50 between protrusion 47 and nail head 22' and contributes little to retaining nail head 22' in contact with die 16'. In contrast, the present invention, illustrated for example in FIG. 4, locates wall 80 at about the same elevation as the die and with its upper end at substantially the same elevation as lead nail head 72. Thus, the coupling of the locking action of wall face 80F to lead nail head 72 is much improved, and the ruggedness and temperature cycling resistance of the invented device are better.

A further feature of the invented design is the use of outward leaning wall 80 in combination with cavity 64 surrounded by side 69 of metal base 62. Die bond region 65C, die 66 and wall 80 are located within cavity 64 in metal base 62. This is in contrast to the prior art devices which did not use this combination. The devices of FIGS. 1 and 2 lack wall 80 and the device of FIG. 3 places the device on pedestal 45 o metal base 44. In the device of FIG. 3, peripheral wall 46 is of plastic an merely serves to retain encapsulation 49 during curing. In the device of the present invention cavity 64 is surrounded by side 69 which is part of metal base 62. As a consequence, when encapsulation 88, 89 expands and contracts in response to temperature changes, and with a temperature coefficient of expansion (TCE) exceeding that of metal base 62, then side 69 of base 62 holds encapsulant 88, 89 in compression. In combination with sloping face 80F, this forces encapsulation more tightly against base 62 and lead head 72, thereby improving the high temperature ruggedness and improving reliability. This is a particular feature of the present invention.

Typical diodes useful for vehicle alternator applications are rotationally symmetric around the long axis of lead 70. They may be either of the press-fit or clamped variety. For example, base 62 is circular with an outer diameter of about 10-15 mm and height of about 5-9 mm. Cavity 64 typically has a flat, central die mount portion about 6-8 mm or less in diameter to accommodate semiconductor die ranging in size from about 3.2-5.5 mm on a side (square or rectangular) or about 3-7 mm diameter (circular). Lead 70 has head portion 72 of about 3-6 mm diameter and about 0.3-3 mm, typically about 0.5-1.5 mm, thick at the head periphery. The portion of lead 70 extending away from base 62 typically has a diameter of about 1-2 mm. The length of lead 70 varies according to the application, but about 10-25 mm is typical. Wall 80 is conveniently about 0.1-0.5 mm thick (typically about 0.28 mm) and spaced about 0.5-2 mm away from the die edge or about 0.5-3 mm away from the outer perimeter of lead head 72, whichever is closest to the wall, and about 0.5-2 mm from cavity sidewall surface 85.

Wall 80 conveniently has 81 height above bottom 65C of base 62 of about 1-2 mm, typically about 1.2-1.3 mm, with about 1.25 mm being preferred for silicon die having thickness 82 in the range of about 0.1-0.3 mm. Lower face 72L of lead head 72 has elevation 83 about 0.3-0.5 mm and upper face 72U of lead head 72 has elevation 87 about 1.0-3.5 mm above die mount region 65C typically about 1.3 mm. Solder 68, 74 is typically about 0.05-0.15 mm thick. Thickness 90 of encapsulation 88 above upper nail head surface 72U is desirably at least 1.5 mm and preferably 2-4 mm or greater. Where the upper surface of lead head 72 is not substantially flat or with a slope much greater than that shown for example in FIG. 4, additional thickness of encapsulant above the lead head may be provided so as to prevent the lead head from being exposed or the plastic above it from being unduly thin and weak.

The minimum cavity depth is substantially determined by the combined height of the die, solder, lead head, and encapsulant thickness desired above the lead head. Deeper cavities can be used. So long as the cavity depth equals or exceeds the minimum, then the requisite amount of encapsulant will be present above the lead head without having to heap the encapsulant up above the rim of the cavity sidewall. The upper surface of the encapsulant may be made approximately level with the tops of the base sidewalls or may slope down or up toward the center lead, so long as the desired amount of encapsulant is maintained above the lead head. In general, the thicker the encapsulant above the lead head, the stronger the device. However, encapsulant thicknesses above the lead head much beyond about half the cavity diameter add little further strength. It is important that the encapsulant covering the flattened head of the lead be of sufficient thickness so as to provide mechanical strength to supplement the solder in holding the lead head against the die and resist tension on the lead. The base height and cavity depth can be adjusted to provide the desired encapsulant thickness above the lead head, depending on the die thickness, solder thickness, and lead head thickness.

A silica filled epoxy without about 73-78% silica is preferred for encapsulant 88 but other encapsulant materials well known in the art can also be used. The use of a refractory filler makes the epoxy harder and stronger. It is desirable that the thermal coefficient of expansion (TCE) of encapsulant 88 be as close as practical to that of metal base 62, and preferably not be smaller than the TCE of metal base 62.

Many encapsulant materials, including some used in connection with the invented device structure and method have a tendency to shrink slightly on curing, even when heavily filled. The present invention works well with encapsulants which exhibit shrinkage, providing excellent thermal cycling tolerance and lead pull strength despite such shrinkage. This is a particular feature of the present invention.

Devices having dimensions substantially similar to those listed above and having configurations corresponding to FIGS. 1, 3 and 4 were subjected to thermal (power) cycling stress testing to evaluate their relative durability. Similar semiconductor die were used in each configuration. Devices of the type illustrated in FIG. 2 were not tested because their substantially higher cost makes them unsuitable for many applications even though excellent power cycling performance is anticipated. The devices were repetitively cycled between $T_{min} = 40°$ C. and $T_{max} = 175°$ C. by applying and removing a forward current of IF = 30 Amps. The on/off periods were approximately 90/120 seconds, respectively, and were automatically triggered by the devices reaching the preset values of $T_{min}$ and $T_{max}$.

Groups of devices were subjected to repetitive power cycling and then electrically tested at various intervals to determine the number of electrical failures, i.e., the percentage of devices whose electrical properties departed substantially from the pre-test values. The following results were obtained:

| TEST LOT ID | NUMBER OF POWER CYCLES TO REACH THE INDICATED PERCENTAGE FAILURES | |
|---|---|---|
| | 10% | 50% |
| A | 3600 | 5000 |
| B | 4500 | 6500 |
| C | 5700 | 7000 |
| D | 8000 | 20000 |

The number of power cycles needed to reach the indicated percentage failures were determined from Weibull curves using means well known in the art (see for example, W. Weibull, "Fatigue Testing and Analysis of Results", Pergamon Press, London, 1961, and W. Weibull, "A Statistical Distribution Function of Wide Applicability", *J. Appl. Mech.*, Sept 1951, pg 293).

The identifiers A-D refer to groups of devices made by various diode manufacturers. The group A devices were made by Motorola, Inc., and had substantially the structure illustrated in FIG. 1. The group B devices were made by a competing company and had the structure illustrated in FIG. 3. The group C devices were made by Motorola, Inc., and had the structure illustrated in FIG. 5.

FIG. 5 is a highly simplified cross-sectional view of axial-lead, press-fit diode 91 having base 92 with cavity 93, lead 94 with nail head portion 95, silicon die 96 soldered between base 92 and nail head 95 in substantially the same manner as for the other devices discussed herein, and encapsulation 97. Base 92 has sidewall portion 98 curved inwardly toward central lead 94 so that portion 99 of encapsulation 97 is captured between inwardly sloping sidewall portion 98 and the upper surface of lead head 95.

The group D devices were made by Motorola, Inc., and had the structure illustrated in FIG. 4, according to a preferred embodiment of the present invention. These devices provided from 122-300% improvement in power cycling tolerance over the prior art arrangement of FIG. 1, 77-208% improvement over the prior art devices of FIG. 3, and 40-185% improvement over the devices of FIG. 5. This is a very significant improvement in temperature (power) cycling performance and indicates that the devices of the present invention can be expected to have substantially improved reliability as compared to prior art or other devices.

In addition to the power cycling behavior, the lead stiffness and pull strength of the devices of the present invention was also measured. The devices of the present invention were found to have an axial lead stiffness of 1074 kg/cm (6000 lb/in) at 190° C. The lead stiffness is measured within the elastic limit of the lead. It is desirable to have a large lead stiffness. The pull strength is determined by the force necessary to break the lead or pull it away from the device. With the invented arrangement, the lead pull strength corresponded to the failure strength of the lead wire itself, that is, when the lead was pulled to destruction, the lead wire external to the encapsulation failed before there was any separation of the lead from the die or encapsulation or any other failure of the lead or lead joints internal to the device.

FIG. 6 shows another embodiment of the present invention in the form of a double, "double slug" diode. Diode 100 has base 102 having opposed cavities 104, 105 containing, respectively, die 106, 107 and slug contacts 108, 109. Walls 110, 111 and die 106, 107 and contacts 1-8, 109 are provided in substantially the same manner as in cavity 64 of FIG. 4. Slugs 108, 109 are provided with notches 114, 115 to assist retention in encapsulation 112, 113. A single, "double slug" diode is obtained by omitting one die and forming the corresponding slug as part of the base as shown in FIG. 7. Prime reference numbers are used in FIG. 7 to indicate regions analogous to those identified in connection with FIG. 6.

The improved devices of the present invention are conveniently constructed according to the following method. Bases made preferably of OFHC copper are formed to have the internal cavity configuration illustrated in FIG. 3 combined with whatever external configuration is desired to meet a particular device footprint. As those of skill in the art appreciate, the lateral dimensions of the cavity depend on the size of the die that must be accommodated and, the larger the die, the larger the cavity. It is desirable that the outward leaning wall of the present invention be formed as an integral part of the base and at the same time as the base, but that is not essential. The root of the outward leaning wall is desirably spaced about 0.5-2 mm outside the lateral periphery of the die or about 0.5-3 mm outside the lateral periphery of the flattened head portion of the lead, whichever is larger. If the root of the wall and die mount region 65C have the same elevation, then the wall has a height above region 65C typically about 0.5-1.5 mm greater than the elevation of the top surface of the die or bottom bottom of the lead head above cavity bottom portion 65C and is about level with the top surface of the nail head at its periphery. Wall 80 touch should not lead head 72 since this would short the device.

It is important that the gap between the top of wall 80 and sidewall surface 85 not be too narrow. If it is too narrow then insufficient encapsulant may be present in the gap between the top of wall 80 and sidewall surface 85 to provide the needed mechanical strength in that location. For example, when a pull is exerted on lead 70 or when differential thermal expansion or contraction creates an upward force on lead head 72, this pull or force is transmitted in part to encapsulant 88 above lead head 72, then through the portion of encapsulant 88 between the top of wall 80 and sidewall surface 85, then to encapsulant region 89 between leaning wall surface 80F and sidewall surface 85, and thence to wall 80. If the gap between the top of wall 80 and sidewall surface 85 is too narrow, then the encapsulant therein will have insufficient strength and may crack during curing or thermal cycling of the device or fail during lead pull. Therefore, in order to achieve adequate lead pull strength and thermal cycling endurance it is important that this gap not be too small.

The gap area, which is determined approximately by the product of the gap width times the gap perimeter, should be large enough so that the stress in the encapsulant in that region is below the failure stress of the encapsulant material at the temperatures of interest. Based on the teachings herein, those of skill in the art will understand how to determine the minimum gap area, perimeter and width depending upon the particular encapsulant material intended to be used and the pull force or expansion/contraction force expected to be encountered at the temperatures of interest.

Also, if the gap is too narrow, it becomes increasingly difficult for encapsulant 88 to flow past the top of wall 88 into region 89 between wall 80 and sidewall surface 85. It is desirable that region 89 be substantially filled with encapsulant. A simple rule of thumb is that the upper end of outward leaning wall 80 should preferably not approach cavity sidewall 85 closer then about half the amount of wall height 84.

Wall 80 must withstand the upward directed force transferred to it through encapsulant 88, 89. This is accomplished by having the cross-sectional area of wall 80 (which is approximately equal to the wall thickness times the wall perimeter) be larger than area determined by dividing the largest anticipated upward force by the yield strength (i.e., force/area for inelastic failure) of the wall material. Those of skill in the art will understand based on the description herein how to determine the minimum required wall cross-sectional area (and perimeter and thickness) for any particular device arrangement.

The base, die and lead are conveniently attached by use of solder preforms, but other bonding means well known in the art may also be employed. Assuming solder preforms are used, then the die bond preform, the die, the lead bond preform and the lead are placed in the cavity and centrally aligned. This is conveniently accomplished using jigs to hold the various piece parts in their intended locations.

The base, die, lead and preforms are heated to melt the solder and then cooled so that the solder solidifies to bond the parts together. Means and methods for doing this are well known in the art. While the base, die and lead may be attached in a single heating operation, this may also be accomplished in two separate heating operations, a first to attach the die to the base and a second to attach the lead to the die. Either arrangement works satisfactorily, but use of a single operation is preferred.

Once the base, die and lead are attached, the die edge is desirably cleaned and coated with a passivant (e.g., a polyimide or silicone rubber) and cured using means well known in the art, but this is not essential. The outward leaning wall serves as a convenient dam to retain the passivant in close proximity to the die edge so that, other things being equal, less passivant is needed.

After passivation and cure, the encapsulant (e.g., a filled epoxy) is applied using means well known in the art to substantially surround the up-standing, outward leaning wall and substantially fill the remaining space in the cavity. Materials and methods for performing such encapsulation are well known.

Having described the inventions those of skill in the art will understand that it provides an improved structure and method for a solid state device, particularly a semiconductor diode suitable for use in vehicle applications. Further the invented structure employs a minimum number of piece parts and inexpensive materials, is easy to manufacture, and provides high lead pull stiffness, adequate lead pull strength, mechanical ruggedness and low cost, combined with substantially improved temperature (power) cycling tolerance. This combination of properties is greatly desired for practical applications, particularly in vehicle electrical systems.

While the present invention has been described in terms of particular embodiments and examples, e.g., axially lead press-fit or clamped diodes, those of skill in the art will understand based on the description herein that the present invention is applicable to other types of electronic devices, for example and without intending limitation, triacs, transistors, thyristor, etc., and to other types of packages, for example and without intending limitation, symmetrical axial lead types, non-axial lead types, stud types, bolt-down types, etc.

Further, while the present invention has been illustrated by an embodiment in which peripheral portion 65P and die bond portion 65C of cavity bottom 65 are at substantially the same elevation, this is not essential. Peripheral portion 65P maybe higher or lower than central portion 65C. What is important is that wall 80 be located in close proximity to die 66, that wall face 80F lean outward, that the top of wall 80 be higher than the upper surface of die 66, preferably about equal with the upper surface of lead head 72, that wall 80 be located as close to die 66 or lead head 72 as is practicable while allowing sufficient manufacturing tolerance for locating die 66 and lead head 72 within wall 80 without contact therebetween head 72 and wall 80, and that the outward leaning top of wall 80 not approach too closely to the adjacent cavity sidewall so as to prevent the encapsulant from covering outward leaning wall face 80F and substantially filling the space between face 80F and cavity sidewall 85.

In addition, while wall 80 has been illustrated as being of substantially uniform thickness and bent outwardly as it extends away from cavity bottom 65, this is not essential. It is only essential that outward face 80F lean outward. Wall 80 may have non-uniform thickness, in which case the inner face of wall 80, opposite face 80F, may lean outward at a greater or smaller angle than face 80F, and may also lean inward or be vertical. Having both faces of wall 80 lean outward is preferred because of the ease with which such configuration may be formed.

Accordingly, it is intended to include these and other variations as will occur to those of skill in the art based on the description herein in the claims that follow.

We claim:

1. A rectifier comprising:
   a metallic base with opposed first and second major faces and a cavity extending into the base from the first face, wherein the cavity has a bottom and a side extending between the bottom and the first face, wherein the bottom of the cavity has a central region for receiving a rectifier die and a peripheral region located between the central region and the side of the cavity;
   a rectifier die with one face mounted on the central region of the bottom of the cavity;
   a metallic electrode attached to a second, opposed, face of the rectifier and extending away from the base;
   an inclined wall located between the central region and the side of the cavity, and having at least the same elevation above the bottom of the cavity as the one face of the rectifier die, and extending upwardly and outwardly from the bottom of the cavity part way toward the first surface; and
   an encapsulation in the cavity covering edges f the rectifier die and the inclined wall.

2. The rectifier of claim 1 wherein the inclined wall is integral with the base.

3. The rectifier of claim 1 wherein the opposed second face of ht erectifier die has a first predetermined elevation above the bottom of the cavity and the inclined wall has a first height measured form the bottom of the cavity which exceeds the first elevation.

4. The rectifier of claim 3 wherein the metallic electrode has a flattened portion in contact with the second, opposed, face of the rectifier die, located at a second predetermined elevation above the bottom, and the first height at least equals the second elevation.

5. An axially symmetric solid state device comprising:
   a metallic base having opposed, substantially circular, first and second faces;
   a cavity with a substantially flat bottom, and with a side between the first face and the bottom extending into the base a predetermined first distance from the first face;
   a semiconductor die having a first face bonded to a central die mount region on the cavity bottom, an opposed second face and a side in between;
   an outwardly inclined wall extending upwardly from the cavity bottom toward the first surface to at least the same elevation as the first face of the semiconductor die and located between the cavity side and the side of the semiconductor die; and
   an encapsulation having a first part covering the side of the die and a second part covering the wall.

6. The device of claim 5 further comprising an axial lead having a substantially circular flat head portion attached to the opposed second face of the semiconductor die, located laterally within the wall, and at least partially enclosed within the encapsulation.

7. The device of claim 6 wherein the wall has a height measured above the bottom at least equal an elevation, measured above the bottom, of the head portion of the axial lead.

8. The device of claim 5 wherein the wall inclines outwardly at substantially 3–60 degrees with respect to normal to the bottom of the cavity.

9. The device of claim 5 wherein the wall is integral with the base.

10. The device of claim 6 wherein the encapsulation comprises a passivation portion in contact with the semiconductor die and a harder second portion enclosed the wall and substantially filling the cavity.

* * * * *

UNITED STATES PATENT AND TRADEMARK OFFICE
CERTIFICATE OF CORRECTION

PATENT NO. : 5,005,069
DATED : April 2, 1991
INVENTOR(S) : Wasmer et al It is certified that error appears in the above-identified patent and that said Letters Patent is hereby corrected as shown below:

Column 12, claim 3, line 15, change "ht erectifier" to --the rectifier--.

Column 12, claim 3, line 17, change "form" to --from--.

Column 12, claim 10, lines 58-59, change "enclosed" to --enclosing--.

Signed and Sealed this

Ninth Day of February, 1993

Attest:

STEPHEN G. KUNIN

Attesting Officer

Acting Commissioner of Patents and Trademarks